(12) United States Patent
Wei et al.

(10) Patent No.: US 9,373,817 B2
(45) Date of Patent: Jun. 21, 2016

(54) SUBSTRATE STRUCTURE AND DEVICE EMPLOYING THE SAME

(71) Applicant: Industrial Technology Research Institute, Hsinchu (TW)

(72) Inventors: Hsiao-Fen Wei, New Taipei (TW); Kun-Lin Chuang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/737,882

(22) Filed: Jun. 12, 2015

(65) Prior Publication Data

US 2016/0013111 A1    Jan. 14, 2016

Related U.S. Application Data

(60) Provisional application No. 62/023,374, filed on Jul. 11, 2014.

(51) Int. Cl.
*H01L 23/48* (2006.01)
*H01L 51/52* (2006.01)

(52) U.S. Cl.
CPC .................. *H01L 51/5253* (2013.01)

(58) Field of Classification Search
CPC .................................................. H01L 51/5253
USPC ......... 257/751, 686, 685, 777, 687, 778, 779, 257/780, 786
See application file for complete search history.

(56) References Cited

U.S. PATENT DOCUMENTS

| | | | |
|---|---|---|---|
| 6,548,912 B1 | 4/2003 | Graff et al. |
| 6,664,137 B2 | 12/2003 | Weaver |
| 6,835,950 B2 | 12/2004 | Brown et al. |
| 6,897,474 B2 | 5/2005 | Brown et al. |
| 7,015,640 B2 | 3/2006 | Schaepkens et al. |
| 7,187,119 B2 | 3/2007 | Weaver |
| 7,265,807 B2 | 9/2007 | Lifka et al. |

(Continued)

FOREIGN PATENT DOCUMENTS

| | | |
|---|---|---|
| JP | 3637678 B2 | 4/2005 |
| TW | I384583 B | 2/2013 |
| TW | M472241 U | 2/2014 |

OTHER PUBLICATIONS

Asakawa et al., "Combining polymers with diamond-like carbon (DLC) for highly functionalized materials", Surface & Coatings Technology, vol. 206, Issue 4, Nov. 15, 2011, pp. 676-685.

(Continued)

*Primary Examiner* — Hoa B Trinh
(74) *Attorney, Agent, or Firm* — Birch, Stewart, Kolasch & Birch, LLP

(57) ABSTRACT

A substrate structure and a device employing the same are disclosed. An embodiment of the disclosure provides the substrate structure including a flexible substrate and a first barrier layer. The flexible substrate has a top surface, a side surface, and a bottom surface. The first barrier layer is disposed on and contacting the top surface of the flexible substrate, wherein the first barrier layer consists of Si, N, and Z atoms, wherein the Z atom is selected from a group of H, C, and O atoms, and wherein Si of the first barrier layer is present in an amount from 35 to 42 atom %, N of the first barrier layer is present in an amount from 10 to 52 atom %, and Z of the first barrier layer is present in an amount from 6 to 48 atom %.

20 Claims, 6 Drawing Sheets

(56) References Cited

U.S. PATENT DOCUMENTS

| | | |
|---|---|---|
| 7,291,397 B2 | 11/2007 | Miyadera et al. |
| 7,297,391 B2 | 11/2007 | Hetzler et al. |
| 7,341,766 B2 | 3/2008 | Kishimoto et al. |
| 7,648,925 B2 | 1/2010 | Moro et al. |
| 7,683,534 B2 | 3/2010 | Weaver |
| 7,727,601 B2 | 6/2010 | Burrows et al. |
| 7,828,618 B2 | 11/2010 | Park et al. |
| 7,928,646 B2 | 4/2011 | Ryuji et al. |
| 8,034,419 B2 | 10/2011 | Erlat et al. |
| 8,771,834 B2 | 7/2014 | Uemura et al. |
| 2003/0197197 A1 | 10/2003 | Brown et al. |
| 2004/0031977 A1 | 2/2004 | Brown et al. |
| 2004/0119068 A1 | 6/2004 | Weaver |
| 2007/0045819 A1* | 3/2007 | Edwards ............ H01L 23/04 257/704 |
| 2007/0152213 A1 | 7/2007 | Weaver |
| 2011/0193067 A1 | 8/2011 | Lee et al. |
| 2011/0204361 A1 | 8/2011 | Nishiki et al. |
| 2013/0140547 A1 | 6/2013 | Lee et al. |
| 2014/0166995 A1 | 6/2014 | Lee et al. |
| 2014/0209877 A1 | 7/2014 | Lee et al. |
| 2014/0231767 A1 | 8/2014 | Tsai et al. |
| 2014/0339517 A1 | 11/2014 | Park et al. |
| 2014/0339527 A1 | 11/2014 | Lee et al. |

OTHER PUBLICATIONS

Choi et al., "Design and fabrication of compositionally graded inorganic oxide thin films: Mechanical, optical and permeation characteristics", Acta Materialia, vol. 58, Issue 19, Nov. 2010, pp. 6495-6503.

Choi et al., "Homogeneous $Al_2O_3$ multilayer structures with reinforced mechanical stability for high-performance and high-throughput thin-film encapsulation", Scripta Materialia, vol. 62, 2010, pp. 447-450.

Pradhan et al., "Effect of zirconium oxide nanopowder on the thermal, chemical and gas barrier properties of starch", Materials Science in Semiconductor Processing, vol. 23, Jul. 2014, pp. 115-121.

Tashiro et al., "Enhancement of the gas barrier property of polymers by DLC coating with organosilane interlayer", Diamond and Related Materials, vol. 35, May 2013, pp. 7-13.

Wu et al., "Organosilicon/silicon oxide gas barrier structure encapsulated flexible plastic substrate by using plasma-enhanced chemical vapor deposition", Surface and Coatings Technology, vol. 206, Issue 22, Jun. 25, 2012, pp. 4685-4691.

* cited by examiner

SUBSTRATE STRUCTURE AND DEVICE EMPLOYING THE SAME

CROSS REFERENCE TO RELATED APPLICATION

This application claims the benefit of U.S. Provisional Application No. 62/023,374, filed on Jul. 11, 2014, which is incorporated herein by reference.

TECHNICAL FIELD

The disclosure relates to a substrate structure, and a device employing the same.

BACKGROUND

As flexible devices (such as a flexible display device) have recently attracted increasing attention, research is being actively in progress. Flexible devices are manufactured by forming an electric or optical element on a flexible substrate made of a flexible material such as plastic.

A flexible device, such as a flexible display device, may include a driving element (such as a thin film transistor (TFT)) for controlling the operation of each pixel or generating an electrical signal, and/or an image display element (such as an organic light-emitting diode (OLED)) for displaying images. Since the photoelectric element is vulnerable to external impurities (such as moisture or oxygen), a barrier layer may be disposed below or above the photoelectric element to prevent the external impurities from damaging the flexible device.

However, due to the low adhesion between conventional barrier layers and the flexible substrate, the photoelectric element formed on the barrier layer may peel off the flexible substrate.

SUMMARY

An embodiment of the disclosure provides a substrate structure, including a flexible substrate and a first barrier layer. The flexible substrate has a top surface, a side surface, and a bottom surface. The first barrier layer is disposed on and contacting the top surface of the flexible substrate, wherein the first barrier layer consists of Si, N, and Z atoms, wherein the Z atom is selected from a group of H, C, and O atoms, and wherein Si of the first barrier layer is present in an amount from 35 to 42 atom %, N of the first barrier layer is present in an amount from 10 to 52 atom %, and Z of the first barrier layer is present in an amount from 6 to 48 atom %.

According to another embodiment of the disclosure, a device is provided. The device includes the aforementioned substrate structure and an electronic element. The electronic element is disposed on the first barrier layer of the substrate structure.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
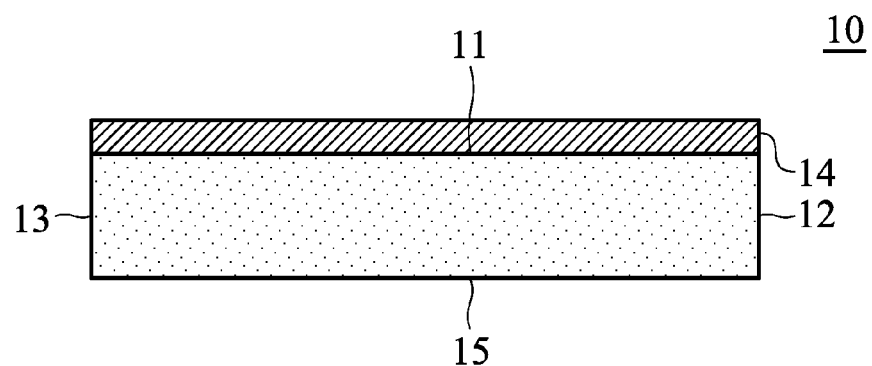
FIG. 1 shows a cross section of a substrate structure according to an embodiment of the disclosure.

This description is made for the purpose of illustrating the general principles of the disclosure and should not be taken in a limiting sense. The scope of the disclosure is determined by reference to the appended claims.

The substrate structure and device of the disclosure is described in detail in the following description. In the following detailed description, for purposes of explanation, numerous details and embodiments are set forth in order to provide a thorough understanding of the present disclosure. The elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but may indicate a non-contact state with one or more intermediate layers between the first layer and the second layer. In the above situation, the first layer does not directly contact the second layer.

The drawings described are only schematic and are non-limiting. In the drawings, the size, shape, or thickness of some of the elements may be exaggerated and not drawn on scale for illustrative purposes. The dimensions and the relative dimensions do not correspond to actual location to practice of the disclosure. The disclosure will be described with respect to embodiments and with reference to certain drawings but the disclosure is not limited thereto.

Moreover, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

According to embodiments of the disclosure, the substrate structure has a first barrier layer disposed on and contacting a top surface of a flexible substrate. Since the first barrier layer includes Si atoms and N atoms which are present in a specific amount, the first barrier layer exhibits a high barrier characteristic, and the adhesion between the first barrier layer and the flexible substrate is improved.

FIG. 1 shows a cross section of a substrate structure 10 according to an embodiment of the disclosure. The substrate structure 10 includes a flexible substrate 12 having a top surface 11, a side surface 13, and a bottom surface 15, and a first barrier layer 14 disposed on and contacting the top surface 11 of the flexible substrate 12. The first barrier layer 14 may consist of Si, N, and Z atoms, wherein the Z atom may be selected from a group of H, C, and O atoms. In order to improve the adhesion between the first barrier layer 14 and the flexible substrate 12, Si of the first barrier layer 14 may be present in an amount from 35 to 42 atom %, N of the first barrier layer 14 may be present in an amount from 10 to 52 atom %, and Z of the first barrier layer 14 may be present in an amount from 6 to 48 atom %. According to an embodiment of the disclosure, the adhesion strength between the flexible substrate 12 and the first barrier layer 14 may be 5B measured according to ASTM D3330. Furthermore, the first barrier layer 14 may exhibit a water vapor transmission rate (WVTR) of equal to or less than 0.1 g/m$^2$day, as determined by ASTM F1249-06 at 40° C. and 90% RH. According to an embodiment of the disclosure, the first barrier layer 14 may have a thickness between 30 nm and 10 μm, and have a visible light transmittance equal to or more than 80%. When the thickness of the first barrier layer 14 is too thin, the first barrier layer 14 would exhibit poor barrier characteristics. On the other hand, when the thickness of the first barrier layer 14 is too thick, the first barrier layer 14 would have a visible light transmittance less than 80%.

Figure 2:
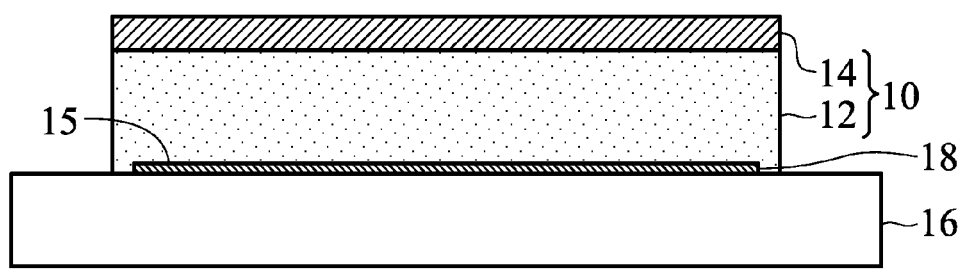
FIG. 2 shows a cross section of a substrate structure disposed on a carrier according to an embodiment of the disclosure.

According to an embodiment of the disclosure, the flexible substrate 12 may be made of polyimide, polycarbonate, polyethersulfone, polyacrylate, polynorbornene, polyethylene terephthalate, polyetheretherketone, polyethylene naphthalate, polyetherimide, or a combination thereof. In an embodiment of the disclosure, the flexible substrate 12 may be disposed on a carrier 16, and a de-bonding layer 18 may be disposed between the flexible substrate 12 and the carrier 16 (i.e. the de-bonding layer 18 formed on the bottom surface 15 of the flexible substrate 12), as shown in FIG. 2. The de-bonding layer 18 may facilitate separating the substrate structure 10 from the carrier 16 via a mold release process.

Figure 3:
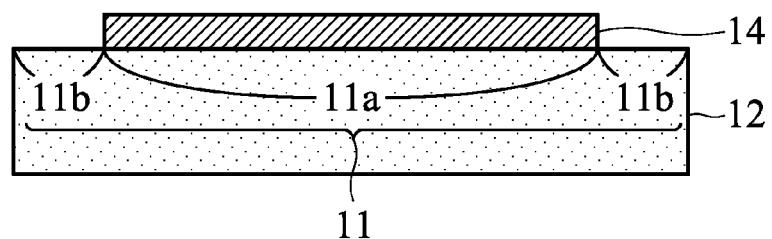
FIGS. 3-6 show cross sections of substrate structures according to some embodiments of the disclosure.
Figure 4:
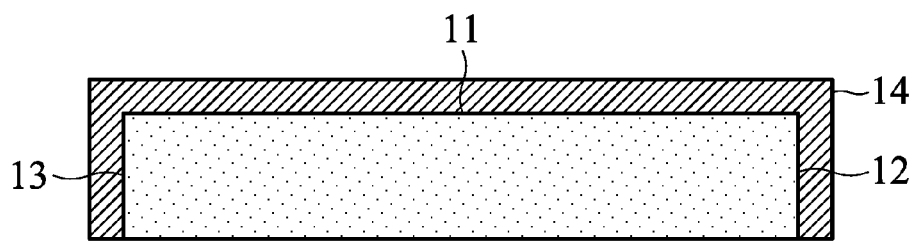

According to an embodiment of the disclosure, the first barrier layer 14 may be disposed on a part of the top surface 11 of the flexible substrate 12. As shown in FIG. 3, the top surface 11 of the flexible substrate 12 can be defined as a first region 11a and a second region 11b, and the first barrier layer 14 is disposed on the first region 11a of the flexible substrate 12. Furthermore, the first barrier layer 14 may be disposed on the flexible substrate 12 to cover the entire top surface 11 of the flexible substrate 12, as shown in FIG. 1. According to an embodiment of the disclosure, as shown in FIG. 4, the first barrier layer 14 may be extended further to cover the side surface 13 of the flexible substrate 12.

Figure 5:
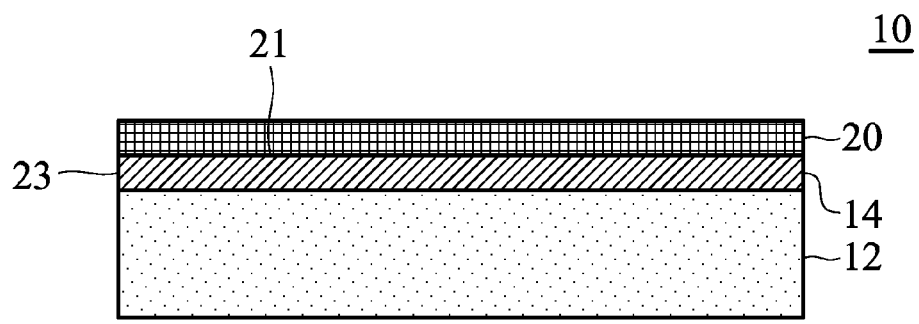
Figure 6:
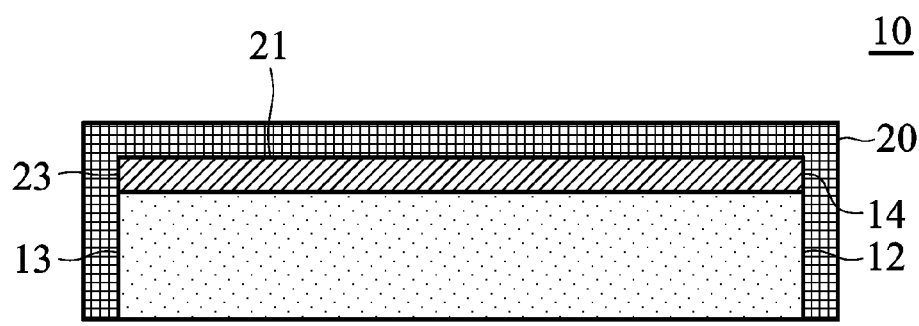

According to other embodiments of the disclosure, the substrate structure 10 may further include a second barrier layer 20 disposed on and contacting the first barrier layer 14 in order to improve the barrier characteristic of the substrate structure 10, as shown in FIG. 5. The second barrier layer 20 may be silicon nitride, silicon oxide, silicon oxynitride, or a combination thereof. In an embodiment of the disclosure, the first barrier layer 14 may have a top surface 21 and a side surface 23, and the second barrier layer 20 covers the entire top surface 21 of the first barrier layer 14, as shown in FIG. 5. Furthermore, the second barrier layer 20 may be extended further to cover the side surface 23 of the first barrier layer 14 and the side surface 13 of the flexible substrate 12, as shown in FIG. 6.

According to other embodiments of the disclosure, the substrate structure 10 may be manufactured with the following steps. First, a flexible substrate 12 is provided. Next, a first barrier layer 14 is formed on and contacts the top surface 11 of the flexible substrate 12. The first barrier layer 14 can be formed by a dry process (such as electron beam evaporation, physical vapor deposition, chemical vapor deposition, or plasma-enhanced chemical vapor deposition) in the presence of a gas source, or a wet process (such as a spin coating, bar coating, blade coating, roller coating, slot-die coating, wire bar coating, or dip coating) with a composition. The gas source may include a silicon-containing gas (such as monosilane ($SiH_4$), disilane ($Si_2H_6$), trisilane ($Si_3H_8$), dichlorosilane ($SiH_2Cl_2$), monochlorosilane ($SiH_3Cl$), trichlorosilane ($SiHCl_3$), tetrachlorosilane ($SiCl_4$), hexachlorodisilane ($Si_2Cl_6$), or a combination thereof), and nitrogen-containing gas (such as nitrogen gas ($N_2$), nitrogen monoxide (NO), ammonia gas ($NH_3$), or a combination thereof). According to an embodiment of the disclosure, the gas source may further include a hydrogen-containing gas, oxygen-containing gas, carbon-containing gas , or a combination thereof, such as a hydrogen gas ($H_2$), methane ($CH_4$), acetylene ($C_2H_2$), ethene ($C_2H_4$), ethane ($C_2H_6$), oxygen gas ($O_2$), ozone ($O_3$), carbon monoxide (CO), carbon dioxide ($CO_2$), nitrous oxide ($N_2O$), or a combination thereof. According to an embodiment of the disclosure, the composition used for forming the first barrier layer 14 may include silicon-containing compound, and nitrogen-containing compound, such as tetraethoxysilane (TEOS), tetramethoxysilane (TMOS), or a combination thereof. In other embodiments of the disclosure, the composition can further include hydrogen-containing compound, oxygen-containing compound, carbon-containing compound, or a combination thereof.

Figure 7:
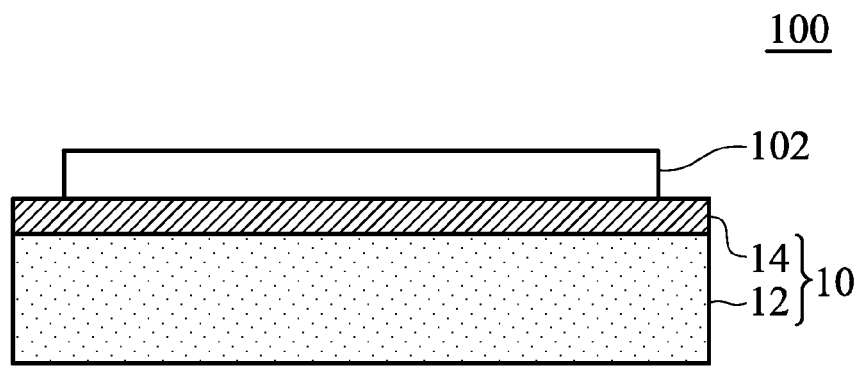
FIGS. 7-12 show cross sections of devices employing the substrate structures according to some embodiments of the disclosure.

According to an embodiment of the disclosure, an electronic element 102 may be further disposed on the first barrier layer 14 of the substrate structure 10, obtaining a device 100 (such as an optical or electronic device). As shown in FIG. 7, the device 100 according to an embodiment of the disclosure includes the aforementioned substrate structure 10, and an electronic element 102 disposed on the first barrier layer 14 of the substrate structure 10. The electronic element 102 may be a touch sensing element, driving element (such as thin film transistor array), display element (such as a liquid-crystal display, or organic electroluminescent element), or a combination thereof.

Figure 8:
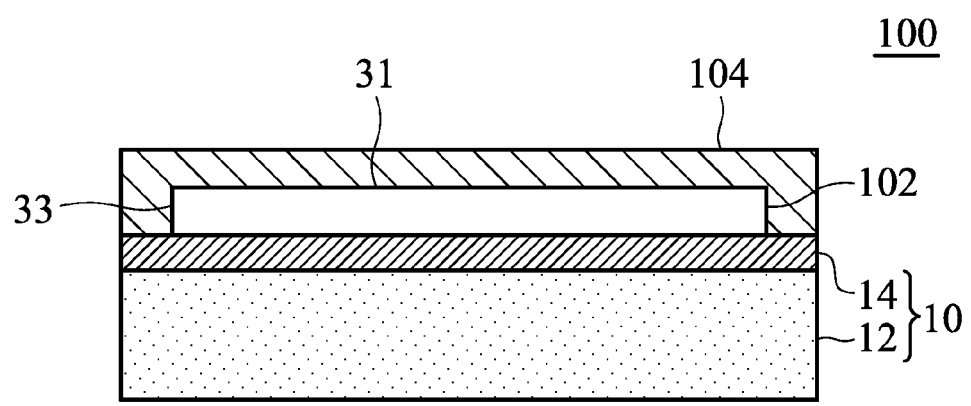
Figure 9:
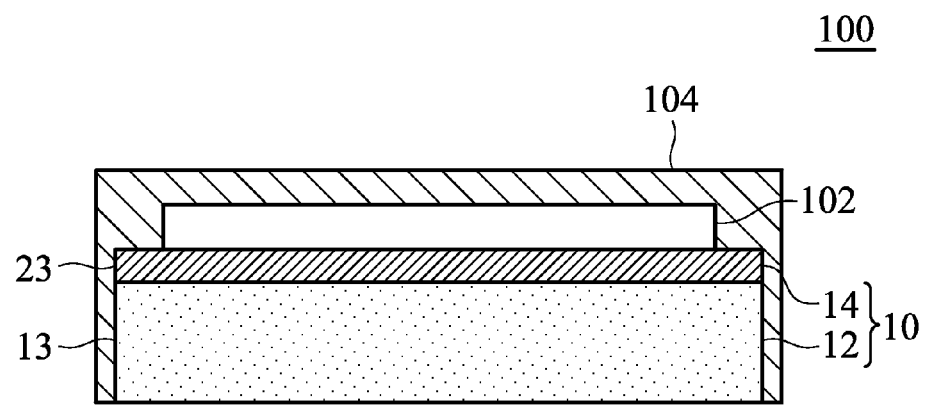

According to an embodiment of the disclosure, the device 100 may further include a passivation layer 104 disposed on the electronic element 102, as shown in FIG. 8. The electronic element 102 may have a top surface 31 and a side surface 33, and wherein the passivation layer 104 may cover the entire top surface 31 of the electronic element 102. In another embodiment, the passivation layer 104 may extend to cover the side surface 33 of the electronic element 102. Moreover, the passivation layer 104 may be extended further to cover the side surface 23 of the first barrier layer 14, and/or the side surface 13 of the flexible substrate 12, as shown in FIG. 9.

Figure 10:
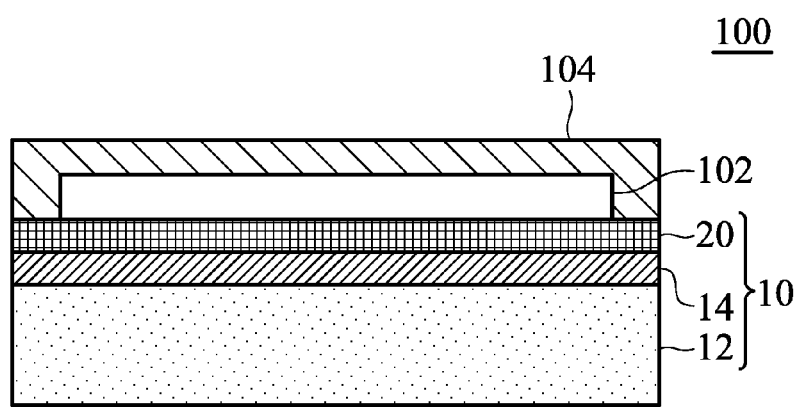

According to an embodiment of the disclosure, the device 100 may further include a second barrier layer 20 disposed between the first barrier layer 14 and the electronic element 102, as shown in FIG. 10. The electronic element 102 is disposed and contacts the second barrier layer 20, wherein the second barrier layer 20 may be silicon nitride, silicon oxide, silicon oxynitride, or a combination thereof.

Figure 11:
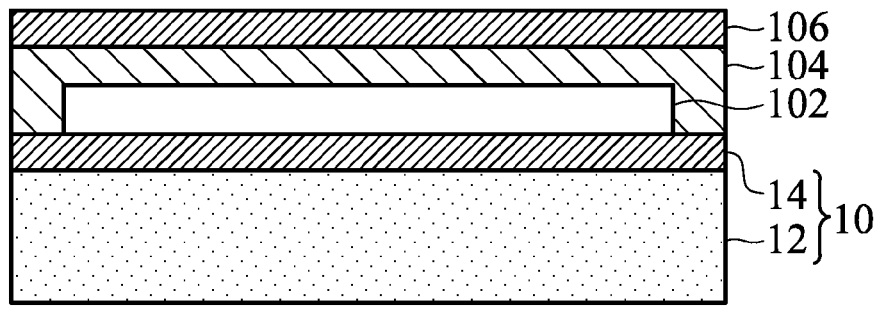

According to an embodiment of the disclosure, a third barrier layer 106 may be disposed on the electronic element 102 to further prevent the electronic element 102 from deterioration due to moisture or oxygen as shown in FIG. 11, wherein the third barrier layer 106 may be the same or different material as the first barrier layer 14. In an embodiment of the disclosure, the third barrier layer 106 may consist of Si, N, and Z atoms, wherein the Z atom is selected from a group of H, C, and O atoms, and wherein Si of the third barrier layer 106 is present in an amount from 35 to 42 atom %, N of the third barrier layer 106 is present in an amount from 10 to 52 atom %, and Z of the third barrier layer 106 is present in an amount from 6 to 48 atom %.

Figure 12:
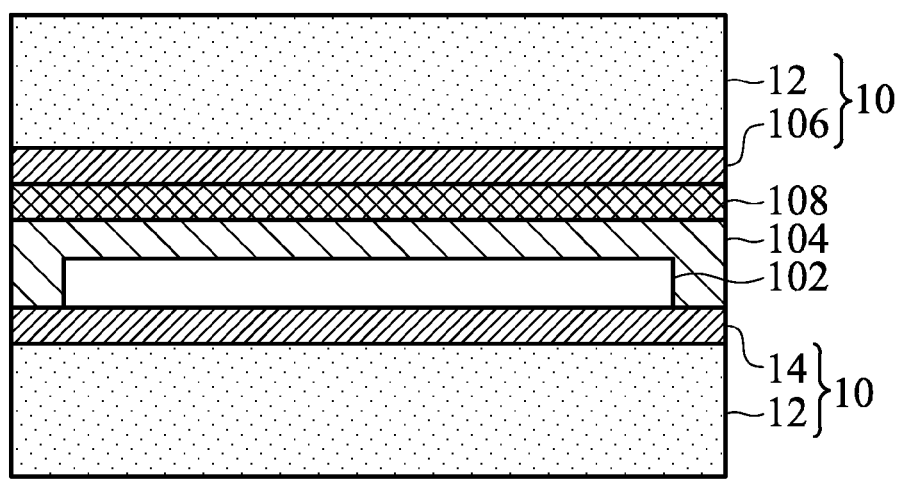

Further, according to embodiments of the disclosure, another substrate structure 10 of the disclosure may serve as a gas barrier substrate and be bonded to the passivation layer 104 of the device 100 as shown in FIG. 8 via an adhesion layer 108, as shown in FIG. 12.

Below, exemplary embodiments will be described in detail with reference to accompanying drawings so as to be easily realized by a person having ordinary knowledge in the art. The disclosure concept may be embodied in various forms without being limited to the exemplary embodiments set forth herein. Descriptions of well-known parts are omitted for clarity, and like reference numerals refer to like elements throughout.

EXAMPLE 1

A polyimide substrate with a thickness of 12 μm was provided. Next, a film of a composition was formed on the polyimide substrate via a spin coating. After baking the film at 120° C., the film altered to an oxygen-containing silicon nitride layer with a thickness of 30 nm formed on the polyimide substrate, obtaining the substrate structure (I). Next, the substrate structure (I) was subjected to a reliability analysis at 85° C. under 85% RH for 500 hr, and then the adhesion strength between the polyimide substrate and the oxygen-containing silicon nitride layer was measured according to ASTM D3330. The result is shown in Table 1. Next, the water vapor transmission rate (WVTR) of the oxygen-containing silicon nitride layer of the substrate structure (I) was measured according to ASTM F1249-06 at 60° C. and 90% RH, and the result is shown in Table 1. Further, after measuring, Si of the oxygen-containing silicon nitride layer is present in an amount of 36 atom %, N of the oxygen-containing silicon nitride layer is present in an amount of 50 atom %, and O of the oxygen-containing silicon nitride layer is present in an amount of 14 atom %.

EXAMPLE 2

A polyimide substrate with a thickness of 12 μm was provided. Next, the polyimide substrate was put into a vapor deposition chamber. After vacuum pumping, the vapor deposition chamber was heated to 200° C., and an atmosphere (including $SiH_4$, and $NH_3$) was introduced into the vapor deposition chamber, wherein the flow rate ratio of $NH_3/SiH_4$ was 3.7. A hydrogen-containing silicon nitride layer with a thickness of 36 nm formed on the polyimide substrate, obtaining the substrate structure (II). Next, the substrate structure (II) was subjected to a reliability analysis at 85° C. under 85% RH for 500 hr, and then the adhesion strength between the polyimide substrate and the hydrogen-containing silicon nitride layer was measured according to ASTM D3330. The result is shown in Table 1. Next, the water vapor transmission rate (WVTR) of the hydrogen-containing silicon nitride layer of the substrate structure (II) was measured according to ASTM F1249-06 at 60° C. and 90% RH, and the result is shown in Table 1. Further, after measuring, Si of the hydrogen-containing silicon nitride layer is present in an amount of 40 atom %, N of the hydrogen-containing silicon nitride layer is present in an amount of 40 atom %, and H of the hydrogen-containing silicon nitride layer is present in an amount of 20 atom %.

TABLE 1

|  | adhesion strength | WVTR (g/m²day) |
| --- | --- | --- |
| Example 1 | 5B | 0.08 |
| Example 2 | 5B | 0.19 |

As shown in Table 1, the barrier layer disposed on and contacting the flexible substrate of the disclosure can exhibit a water vapor transmission rate (WVTR) of less than 0.1 g/m²day, as determined by ASTM F1249-06 at 60° C. and 90% RH. Therefore, the barrier layer can improve the barrier characteristic of the substrate structure. Furthermore, since the adhesion strength between the flexible substrate and the barrier layer is equal to or more than 5B measured according to ASTM D3330, the barrier layer of the disclosure is hard to peel off the flexible substrate resulting in an increase of the reliability of the device fabricated from the substrate structure.

It will be clear that various modifications and variations can be made to the disclosed methods and materials. It is intended that the specification and examples be considered as exemplary only, with a true scope of the disclosure being indicated by the following claims and their equivalents.

What is claimed is:
1. A substrate structure, comprising:
   a flexible substrate having a top surface, a side surface, and a bottom surface; and
   a first barrier layer disposed on and contacting the top surface of the flexible substrate, wherein the first barrier layer consists of Si, N, and Z atoms, wherein the Z atom is selected from a group of H, C, and O atoms, and wherein Si of the first barrier layer is present in an amount from 35 to 42 atom %, N of the first barrier layer is present in an amount from 10 to 52 atom %, and Z of the first barrier layer is present in an amount from 6 to 48 atom %.

2. The substrate structure as claimed in claim 1, wherein an adhesion strength between the flexible substrate and the first barrier layer is 5B measured according to ASTM D3330.

3. The substrate structure as claimed in claim 1, wherein the first barrier layer exhibits a water vapor transmission rate (WVTR) of less than 0.1 g/m²day, as determined by ASTM F1249-06 at 60° C. and 90% RH.

4. The substrate structure as claimed in claim 1, wherein the first barrier layer has a thickness between 30 nm and 10 μm.

5. The substrate structure as claimed in claim 1, wherein the first barrier layer has a visible light transmittance equal to or more than 80%.

6. The substrate structure as claimed in claim 1, wherein the top surface of the flexible substrate has a first region and a second region, and the first barrier layer is disposed on the first region.

7. The substrate structure as claimed in claim 1, wherein the first barrier layer covers the entire top surface of the flexible substrate.

8. The substrate structure as claimed in claim 7, wherein the first barrier layer further extends to the side surface of the flexible substrate.

9. The substrate structure as claimed in claim 1, further comprising:
   a carrier, wherein the flexible substrate is disposed on the carrier; and
   a de-bonding layer disposed between the carrier and the flexible substrate.

10. The substrate structure as claimed in claim 1, further comprising:
a second barrier layer disposed on and contacting the first barrier layer, wherein the second barrier layer is silicon nitride, silicon oxide, silicon oxynitride, or a combination thereof.

11. The substrate structure as claimed in claim 10, wherein the first barrier layer has a top surface and a side surface, and the second barrier covers the entire top surface of the first barrier layer.

12. The substrate structure as claimed in claim 11, wherein the second barrier layer further extends to the side surface of the first barrier layer.

13. A device, comprising:
the substrate structure as claimed in claim 1; and
an electronic element disposed on the first barrier layer of the substrate structure.

14. The device as claimed in claim 13, wherein the electronic element comprises a touch sensing element, driving element, display element, or a combination thereof.

15. The device as claimed in claim 13, further comprising:
a second barrier layer disposed on and contacting the first barrier layer, and the electronic element disposed on the second barrier layer.

16. The device as claimed in claim 15, wherein the second barrier layer is silicon nitride, silicon oxide, silicon oxynitride, or a combination thereof.

17. The device as claimed in claim 15, further comprising:
a third barrier layer disposed on the electronic element, wherein the third barrier layer consists of Si, N, and Z atoms, wherein the Z atom is selected from a group of H, C, and O atoms, and wherein Si of the first barrier layer is present in an amount from 35 to 42 atom %, N of the first barrier layer is present in an amount from 10 to 52 atom %, and Z of the first barrier layer is present in an amount from 6 to 48 atom %.

18. The device as claimed in claim 13, further comprising:
a passivation layer disposed on the electronic element.

19. The device as claimed in claim 18, wherein the electronic element has a top surface and a side surface, and wherein the passivation layer covers the entire top surface of the electronic element.

20. The device as claimed in claim 19, wherein the passivation layer further extends to the side surface of the electronic element.

* * * * *